(12) United States Patent
Fukuda et al.

(10) Patent No.: US 6,903,460 B2
(45) Date of Patent: Jun. 7, 2005

(54) SEMICONDUCTOR EQUIPMENT

(75) Inventors: Yutaka Fukuda, Kariya (JP); Hirofumi Abe, Gamagori (JP); Yoshinori Arashima, Gamagori (JP); Shigeki Takahashi, Okazaki (JP)

(73) Assignee: Denso Corporation, Kariya (JP)

( * ) Notice: Subject to any disclaimer, the term of this patent is extended or adjusted under 35 U.S.C. 154(b) by 50 days.

(21) Appl. No.: 10/689,060

(22) Filed: Oct. 21, 2003

(65) Prior Publication Data

US 2004/0084776 A1 May 6, 2004

(30) Foreign Application Priority Data

Oct. 30, 2002 (JP) ........................................ 2002-316448
Sep. 18, 2003 (JP) ........................................ 2003-326508

(51) Int. Cl.[7] .............................................. H01L 23/48
(52) U.S. Cl. ......................... 257/758; 257/758; 257/342
(58) Field of Search ................................ 257/758, 342, 257/341, 617, 329, 335, 287

(56) References Cited

U.S. PATENT DOCUMENTS

| | | | |
|---|---|---|---|
| 4,636,825 A | 1/1987 | Baynes | |
| 4,948,754 A | 8/1990 | Kondo et al. | |
| 5,192,989 A | 3/1993 | Matsushita et al. | |
| 5,412,239 A | 5/1995 | Williams | |
| 5,468,668 A | * 11/1995 | Neilson et al. ............. | 438/133 |
| 5,672,894 A | 9/1997 | Maeda et al. | |

FOREIGN PATENT DOCUMENTS

| | | |
|---|---|---|
| JP | A-H03-239369 | 10/1991 |
| JP | A-H07-263665 | 10/1995 |

OTHER PUBLICATIONS

Hazel Schofield et al., "Assembly of FlipFET™ Devices", *International Rectifier*, AN–1011, May 22, 2000, pp. 1–6.
"International Rectifier", IRF6150, PD–93943, pp. 1–3.
Hazel Schofield et al., "FlipFET™ MOSFET Design for High Volume SMT Assembly", *International Rectifier*, pp. 1–6.

* cited by examiner

*Primary Examiner*—David Nelms
*Assistant Examiner*—Thinh T. Nguyen
(74) *Attorney, Agent, or Firm*—Posz Law Group, PLC

(57) ABSTRACT

Semiconductor equipment includes a semiconductor substrate, a plurality of transistors having a source cell and a drain cell disposed alternately on the substrate, and upper and lower layer wirings for electrically connecting the source cells and the drain cells. The lower layer wiring includes a first source wiring for connecting the neighboring source cells and a first drain wiring for connecting the neighboring drain cells. The upper layer wiring includes a second source wiring for connecting to the first source wiring and a second drain wiring for connecting to the first drain wiring. A width of the second source wiring is wider than that of the first source wiring, and a width of the second drain wiring is wider than that of the first drain wiring. The second source wiring and the second drain wiring are disposed alternately.

18 Claims, 7 Drawing Sheets

SEMICONDUCTOR EQUIPMENT

CROSS REFERENCE TO RELATED APPLICATION

This application is based on Japanese Patent Applications No. 2002-316448 filed on Oct. 30, 2002, and No. 2003-326508 filed on Sep. 18, 2003, the disclosures of which are incorporated herein by reference.

FIELD OF THE INVENTION

The present invention relates to semiconductor equipment having a plurality of semiconductor devices and upper and lower layer wirings.

BACKGROUND OF THE INVENTION

Semiconductor equipment 100 having a plurality of semiconductor devices 101 and upper and lower layer wirings according to a prior art is disclosed in Japanese Unexamined Patent Application Publication No. H07-263665. As shown in FIG. 13, the semiconductor equipment 100 includes a plurality of laterally diffused metal oxide semiconductor (i.e., L-DMOS) transistors 101 having a source cell S and a drain cell D. The L-DMOS transistors 101 are arranged to have a mesh pattern. The first wiring layer as the lower layer wiring is formed on the source and drain cells S, D through the first interlayer insulation film. Further, the second wiring layer as the upper layer wiring is formed on the first wiring layer through the second interlayer insulation film.

The lower layer wiring is composed of a plurality of the first source wirings 1 and a plurality of the first drain wirings 2. Each first source wiring 1 connects to a plurality of the source cells S, which are aligned in a diagonal direction of the mesh pattern. Each first drain wiring 2 connects to a plurality of the drain cells D, which are also aligned in the diagonal direction. The first source wirings 1 and the first drain wirings 2 are aligned alternately. The upper layer wiring is composed of the second source wiring 3 and the second drain wiring 4. The second source wiring 3 connects to a plurality of first source wirings 1 through contact portions (not shown) disposed under the second source wiring 3, and the second drain wiring 4 connects to a plurality of first drain wirings 2 through contact portions (not shown) disposed under the second drain wiring 4. The second source wiring 3 and the second drain wiring 4 almost equally divide the semiconductor equipment 100, and each of them has a triangle shape.

Since the wirings for connecting each cell in the L-DMOS transistor 101 are formed into double layered structure, i.e., formed into the upper and lower layer wirings, so that an occupation area of the upper and lower layer wirings is reduced. Moreover, each cell can be minimized, so that a chip size of the semiconductor equipment 100 is reduced.

Each of the second source and drain wirings 3, 4 as the upper layer wiring has a wide area so that the electric resistance of the upper layer wiring as a wiring resistance is suppressed. Further, each wide area of the upper layer wiring can be used as a pad region for forming a solder bump. Therefore, the semiconductor equipment 100 can be mounted on a ceramic circuit board or a printed circuit board so that the semiconductor equipment 100 is packaged into a chip size package (i.e., CSP). Therefore, a mounting area of the semiconductor equipment 100 is reduced.

However, each of the source and drain cells S, D connecting to the lower layer wirings is affected by the wiring resistance differently. For example, a source cell B shown in FIG. 13, which is disposed under the second source wiring 3, connects to the second source wiring 3 at a right above contact portion. Therefore, the source cell B is not affected by the wiring resistance of the first source wiring 1 substantially. A source cell C shown in FIG. 13 is disposed under the second drain wiring 4, i.e., the source cell C is not disposed under the second source wiring 3. Therefore, the source cell C is far from a contact portion between the first source wiring 1 and the second source wiring 3, so that the source cell C is much affected by the wiring resistance of the first source wiring 1. In other words, current flowing from the source cell C passes through the first source wiring 1, which is narrow and has a long path.

The above different affection of the wiring resistance breaks down the balance of current flowing through each cell. For example, the current concentrates on the source cell B, and the current does not flow through the source cell C substantially, so that the total withstand voltage of the semiconductor equipment 100 is reduced.

SUMMARY OF THE INVENTION

In view of the above problem, it is an object of the present invention to provide semiconductor equipment having a plurality of semiconductor devices and upper and lower layer wirings. Specifically, the semiconductor equipment has a plurality of semiconductor devices, in which current flows homogeneously so that the semiconductor equipment has a high withstand voltage.

It is another object of the present invention to provide semiconductor equipment having homogeneous current distribution, which can be packaged into a chip size package.

Semiconductor equipment includes a semiconductor substrate, a plurality of transistors having a source cell and a drain cell disposed alternately on the substrate so as to form a mesh pattern, and upper and lower layer wirings for electrically connecting the source cells and the drain cells. The lower layer wiring includes a first source wiring having a striped shape for connecting the neighboring source cells and a first drain wiring having a striped shape for connecting the neighboring drain cells. The upper layer wiring includes a second source wiring having a striped shape for connecting to the first source wiring and a second drain wiring having a striped shape for connecting to the first drain wiring. The second source wiring has a width of a stripe, which is wider than that of the first source wiring, and the second drain wiring has a width of a stripe, which is wider than that of the first drain wiring. The second source wiring and the second drain wiring are disposed alternately.

In the above equipment, a contact portion between the lower layer wiring and the upper layer wiring is disposed alternately and homogeneously on the substrate. Accordingly, current path of the lower layer wiring having narrow striped shape becomes short. Therefore, the wiring resistance of the lower layer wiring does not affect to the transistor substantially. Thus, the current flows in each cell homogeneously so that the semiconductor equipment has a high withstand voltage. Moreover, the semiconductor equipment has homogeneous current distribution, so that the equipment can be packaged into a chip size package.

Preferably the first drain wiring has a minimum width of the stripe, which is narrower than that of the first source wiring. In this case, the contact portion between the drain cell and the first drain wiring can become smaller than the contact portion between the source cell and the first source wiring. Therefore, the minimum width of the first drain wiring becomes narrower than the minimum width of the first source wiring, so that the current path is optimized in accordance with the size of the contact portion. Thus, the wiring resistance of the lower layer wiring is reduced.

Further, semiconductor equipment includes a semiconductor substrate, a plurality of lateral type metal oxide semiconductor transistors having a source cell and a drain cell, which are disposed alternately on a principal plane of the substrate so as to form a mesh pattern, and upper and lower layer wirings disposed on the substrate for electrically connecting the source cells and the drain cells. The lower layer wiring includes a first drain wiring for connecting the neighboring two drain cells disposed in a diagonal direction of the mesh pattern, and a first source wiring for connecting the source cells and surrounding the first drain wiring. The upper layer wiring includes a second source wiring disposed perpendicularly to the first source wiring and having a striped shape for connecting to the first source wiring through a source via-hole, and a second drain wiring disposed perpendicularly to the first drain wiring and having a striped shape for connecting to the first drain wiring through a drain via-hole. The second source wiring has a width of a stripe, which is wider than a minimum width of a stripe of the first source wiring, which is disposed between the neighboring first drain wirings, and the second drain wiring has a width of a stripe, which is wider than a minimum width of a stripe of the first drain wiring. The second source wiring and the second drain wiring are disposed alternately.

In the above equipment, the wiring resistance of the lower layer wiring does not affect to the transistor substantially. Thus, the current flows in each cell homogeneously so that the semiconductor equipment has a high withstand voltage. Moreover, the semiconductor equipment has homogeneous current distribution, so that the equipment can be packaged into a chip size package. Further, the area of the first source wiring is larger than the area of the first drain wiring, so that the source current flowing through the source cell flows mainly in the lower layer wiring. On the other hand, the drain current flowing through the drain cell flows mainly in the upper layer wiring. Thus, the source and drain currents are distributed by the lower and upper layer wirings, respectively, so that degree of freedom of wiring pattern becomes large. Thus, the total wiring resistance is much reduced.

Further, semiconductor equipment includes a semiconductor substrate, a plurality of lateral type metal oxide semiconductor transistors having a source cell and a drain cell, which are disposed alternately on a principal plane of the substrate so as to form a mesh pattern, and upper and lower layer wirings disposed on the substrate for electrically connecting the source cells and the drain cells. The lower layer wiring includes a first source wiring for connecting the neighboring two source cells disposed in a diagonal direction of the mesh pattern, and a first drain wiring for connecting the drain cells and surrounding the first source wiring. The upper layer wiring includes a second source wiring disposed perpendicularly to the first source wiring and having a striped shape for connecting to the first source wiring through a source via-hole, and a second drain wiring disposed perpendicularly to the first drain wiring and having a striped shape for connecting to the first drain wiring through a drain via-hole. The second source wiring has a width of a stripe, which is wider than a minimum width of a stripe of the first source wiring, which is disposed between the neighboring first drain wirings, and the second drain wiring has a width of a stripe, which is wider than a minimum width of a stripe of the first drain wiring. The second source wiring and the second drain wiring are disposed alternately.

In the above equipment, the current flows in each cell homogeneously so that the semiconductor equipment has a high withstand voltage. Moreover, the semiconductor equipment has homogeneous current distribution, so that the equipment can be packaged into a chip size package. Further, the source and drain currents are distributed by the lower and upper layer wirings, respectively, so that degree of freedom of wiring pattern becomes large. Thus, the total wiring resistance is much reduced.

Furthermore, semiconductor equipment includes a semiconductor substrate, a plurality of transistors having a source cell and a drain cell, which are disposed alternately on a principal plane of the substrate so as to form a mesh pattern, a lower layer wiring disposed on the source and drain cells and including a first source wiring for connecting the source cells and a first drain wiring for connecting the drain cells, and an upper layer wiring disposed on the lower layer wiring and including a second source wiring for connecting to the first source wiring through a source via-hole and a second drain wiring for connecting to the first drain wiring through a drain via-hole. At least one of the source and drain via-holes has a predetermined pattern so that a length of periphery of the via-hole becomes maximum.

In the above equipment, the wiring resistance between the first source or drain wiring and the second source or drain wiring through the via-hole becomes small, so that the semiconductor equipment has a high withstand voltage.

Preferably, at least one of the source and drain via-holes has a plurality of small via-holes. In this case, the total length of the periphery of the via-hole becomes larger than that of a via-hole having merely one via-hole. Therefore the wiring resistance at the via-hole is reduced.

Preferably, at least one of the source and drain via-holes has a ring shape. In this case, an inner circumference of the via-hole is added with an outer circumference of the via-hole, so that the total length of the periphery of the via-hole becomes long. Thus, the wiring resistance at the via-hole is reduced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Semiconductor equipment 200 according to a first embodiment of the present invention is shown in FIGS. 1–4. The semiconductor equipment 200 includes a lateral type metal oxide semiconductor (i.e., lateral type MOS) transistor such as a L-DMOS transistor.

Figure 4:
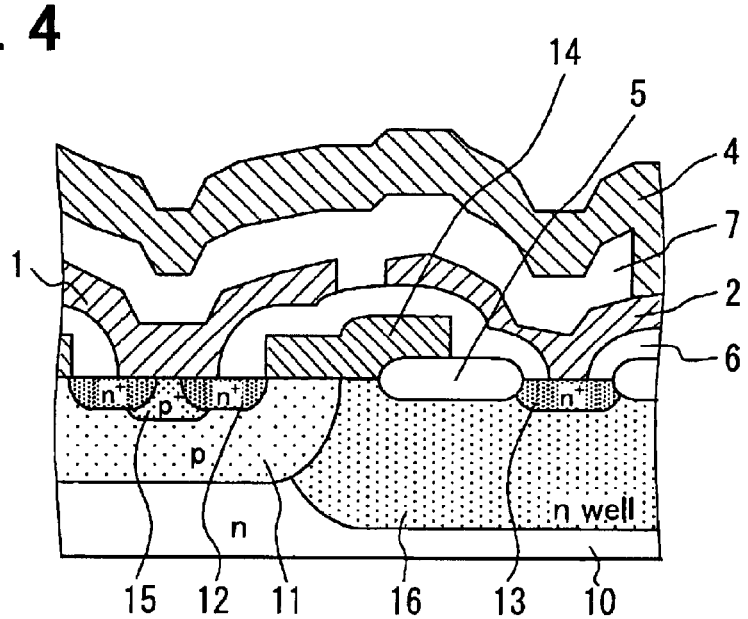
FIG. 4 is a partially enlarged cross-sectional view showing a L-DMOS transistor of semiconductor equipment according to the first embodiment.

As shown in FIG. 4, the L-DMOS transistor is formed on a semiconductor substrate having an N type semiconductor layer 10. On a surface portion of the semiconductor layer 10, a P type channel diffusion region 11 is formed. The channel diffusion region 11 terminates almost at an end of a local oxidation of silicon (i.e., LOCOS) region 5. On a surface portion of the channel diffusion region 11, a $N^+$ type source diffusion region 12 is formed so as to separate from the LOCOS region 5. Further, on the surface portion of the channel diffusion region 11, a $P^+$ type diffusion region 15 is formed so as to contact the source diffusion region 12.

On the surface portion of the semiconductor layer 10, a $N^+$ type drain diffusion region 13 is formed so as to contact the LOCOS region 5. The drain diffusion region 13 is a heavy doped region, i.e., a high concentration region. An N type well region 16 is formed so as to surround the drain diffusion region 13 and the LOCOS region 5. A gate electrode 14 is formed on the surface of the channel diffusion region 11 through a gate insulation film (not shown), which is disposed between the source diffusion region 12 and the LOCOS region 5.

The gate electrode 14 is covered with the first interlayer insulation film 6. On the first interlayer insulation film 6, the first source wiring 1 as a lower layer wiring and the first drain wiring 2 as a lower layer wiring are formed. The first source wiring 1 connects to the source diffusion region 12 and the diffusion region 15 through a contact hole of the first interlayer insulation film 6, i.e., the first source wiring 1 connects to a source of the L-DMOS transistor through the contact hole. The first drain wiring 2 connects to the drain diffusion region 13 through the other contact hole of the second interlayer insulation film 7, i.e., the first drain wiring 2 connects to a drain of the L-DMOS transistor through the other contact hole. The second drain wiring 4 is formed through the third contact hole disposed in the second interlayer insulation film 7.

Figure 1:
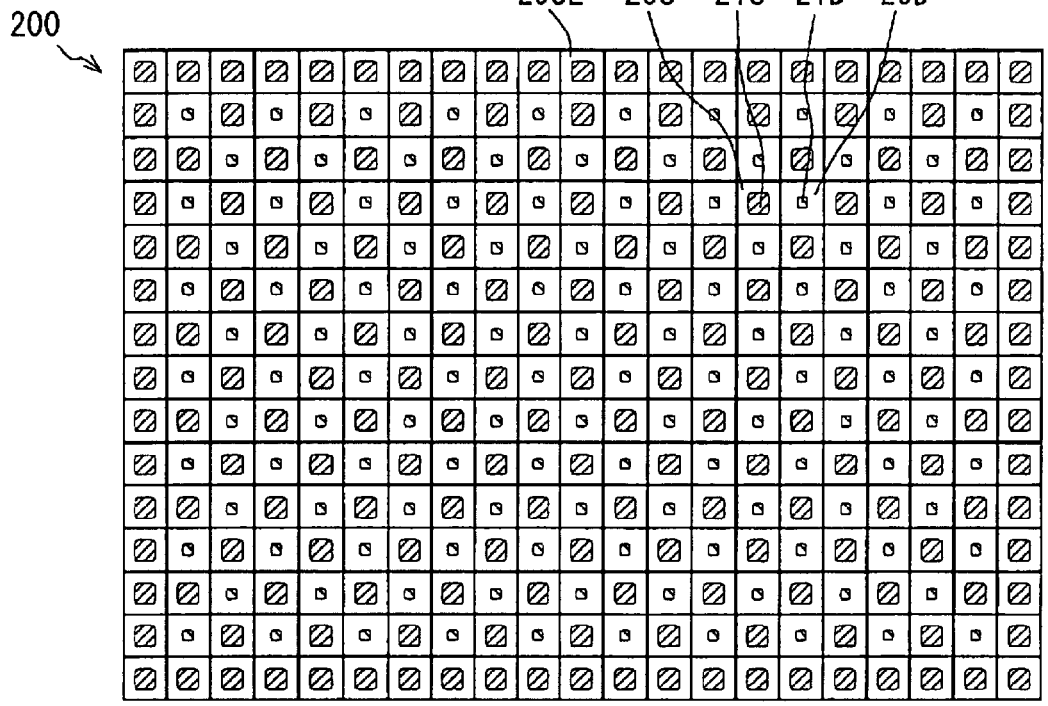
FIG. 1 is a schematic plan view showing semiconductor equipment according to a first embodiment of the present invention.
Figure 2:
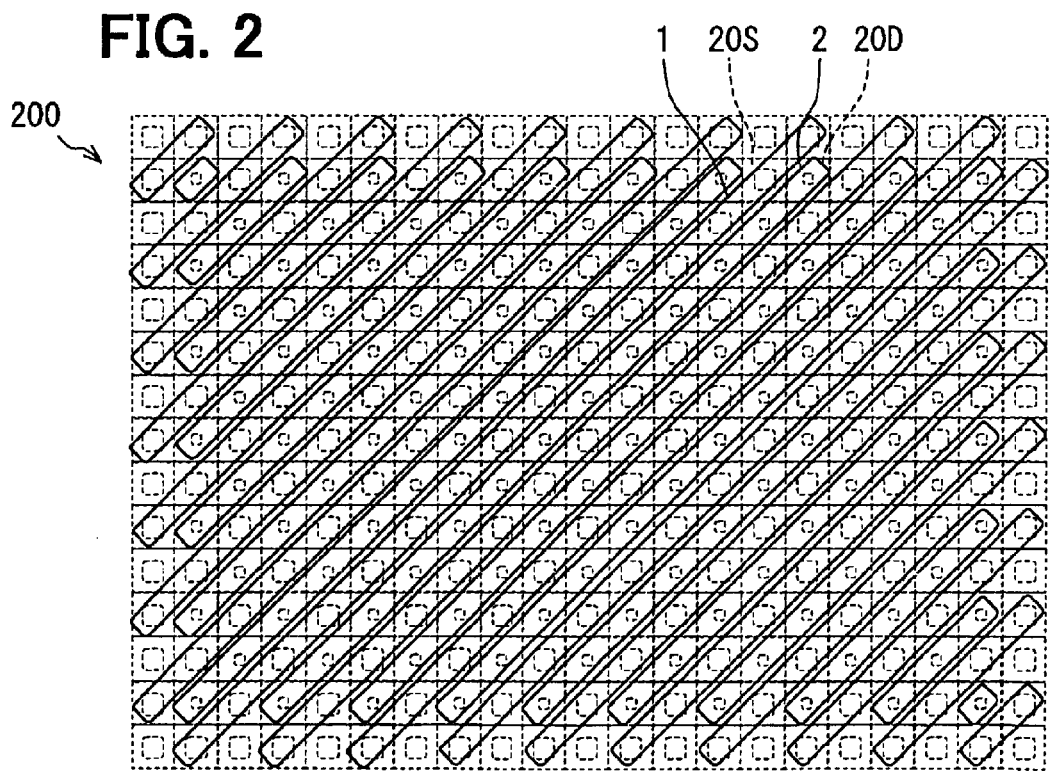
FIG. 2 is a plan view explaining an arrangement of a lower layer wiring of the semiconductor equipment according to the first embodiment.
Figure 3:
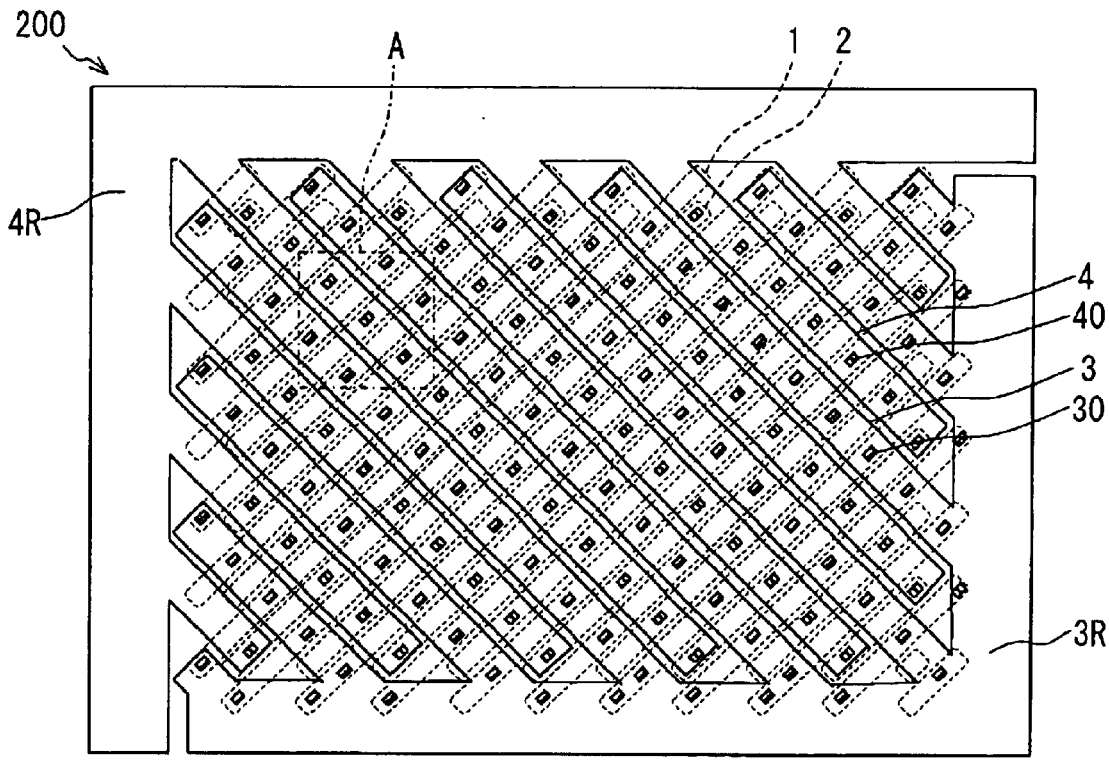
FIG. 3 is a plan view explaining a contact portion between upper and lower layer wirings of the semiconductor equipment according to the first embodiment.

Thus, the lateral type MOS transistor includes a source cell S disposed on the left side in FIG. 4 and a drain cell D disposed on the right side in FIG. 1. FIG. 2 shows a cell arrangement of the semiconductor equipment 200, and a contact portion between the cell and the lower layer wiring. FIG. 3 shows the lower layer wiring of the semiconductor equipment 200. FIG. 4 shows the upper layer wiring and its contact portion between the upper and lower layer wirings.

As shown in FIG. 1, a principal plane of the semiconductor substrate of the semiconductor equipment 200 is patterned into a square mesh pattern. The source cell S or the drain cell D of the lateral type MOS transistor is formed into a unit cell of the square mesh pattern. In FIG. 1, each source cell 20S, 20SE has a large contact portion 21S for connecting between the source of the lateral type MOS transistor and the lower layer wiring. The drain cell 20D has a small contact portion 21D for connecting between the drain of the transistor and the lower layer wiring.

In the semiconductor equipment 200, the source cell 20SE is disposed on a periphery of the mesh pattern so that the source cell 20SE surrounds the inner mesh pattern. The source cell 20S and the drain cell 20D are disposed on the inner mesh pattern alternately. This is because the source cell 20SE stably operated in lower electric potential surrounds the drain cell 20D so that the semiconductor equipment 20 is stably operated. Even when the semiconductor equipment 200 includes a trench for insulating and surrounding the mesh pattern having the source and drain cells 20S, 20SE, 20D of the transistor, a high voltage between the source and drain cells 20SE, 20D is not applied to the edge of the trench. Therefore, the electric potential of the edge of the trench can be stabilized so that current leakage or dielectric breakdown at the trench is suppressed. Here, the leakage or the breakdown is, for example, caused by a crystal defect disposed on the edge of the trench. However, the drain cell 20D can be disposed on the periphery of the mesh pattern.

FIG. 2 shows the lower layer wiring disposed on the mesh pattern. The lower layer wiring is composed of the first source wiring 1 and the first drain wiring 2, which are disposed alternately, and each of them has a striped pattern. The first source wiring 1 connects to the source cells 20S, 20SE disposed in a diagonal direction of the mesh pattern. The first drain wiring 2 connects to the drain cells disposed in the diagonal direction of the mesh pattern.

FIG. 3 shows the upper layer wiring and its contact portion between the upper and lower layer wirings disposed on the lower layer wiring. The upper layer wiring is composed of the second source and drain wirings 3, 4 disposed perpendicularly to the first source and drain wirings 1, 2. The second source wiring 3 connects to the first source wiring 1 through a via-hole 30. The second drain wiring 4 connects to the first drain wiring 2 through a via-hole 40. Each of the second source and drain wirings 3, 4 has a striped pattern, respectively. Each width of the stripe of the second source and drain wirings 3, 4 is wider than that of the first source and drain wirings 1, 2. The second source and drain wirings 3, 4 are disposed alternately. Each of the second source and drain wirings 3, 4 includes a connection portion 3R, 4R for connecting a plurality of stripes so that it forms a comb shaped wiring. Therefore, each stripe as a tooth of comb of the second source and drain wirings 3, 4 faces each other. Thus, each of the source and drain cells 20S, 20D electrically connects in parallel, respectively.

As described above, the striped first source and drain wirings 1, 2 are disposed alternately on the source and drain cells S, D having the mesh pattern so that the same type of cells disposed in the diagonal direction of the mesh pattern are connected together. The striped second source and drain wirings 3, 4 are disposed perpendicularly to the first source and drain wirings 1, 2, and disposed alternately thereon, so that the second source and drain wirings 3, 4 connect to the first source and drain wirings 1, 2 through the via-holes 30, 40, respectively. Therefore, each cross-section, i.e., each contact portion between the first and third source wirings 1, 3 and between the first and second drain wirings 2, 4 is dispose alternately, so that each of the via-holes 30, 40 is disposed on the contact portion, respectively.

Therefore, current path in the first source and drain wiring 1, 2 can become short, so that the influence of the wiring resistance of the lower layer wiring for affecting to each of the source and drain cells S, D becomes small. The current flows in each cell homogeneously so that the semiconductor equipment 200 has a high withstand voltage. Moreover, the first and second source wirings 1, 3 or the first and second drain wirings 2, 4 electrically connect to the source or drain cells 20S, 20D, respectively. Therefore, each connection portion 3R, 4R of the second source and drain wirings 3, 4 can have a predetermined area so that the connection portion 3R, 4R is used as a pad region for forming a solder bump. Thus, the semiconductor equipment 200 can be mounted on a ceramic board or a printed circuit board so that the semiconductor equipment 200 is packaged into a chip size package (i.e., CSP). Thus, a mounting area of the semiconductor equipment 200 is reduced.

Figure 5:
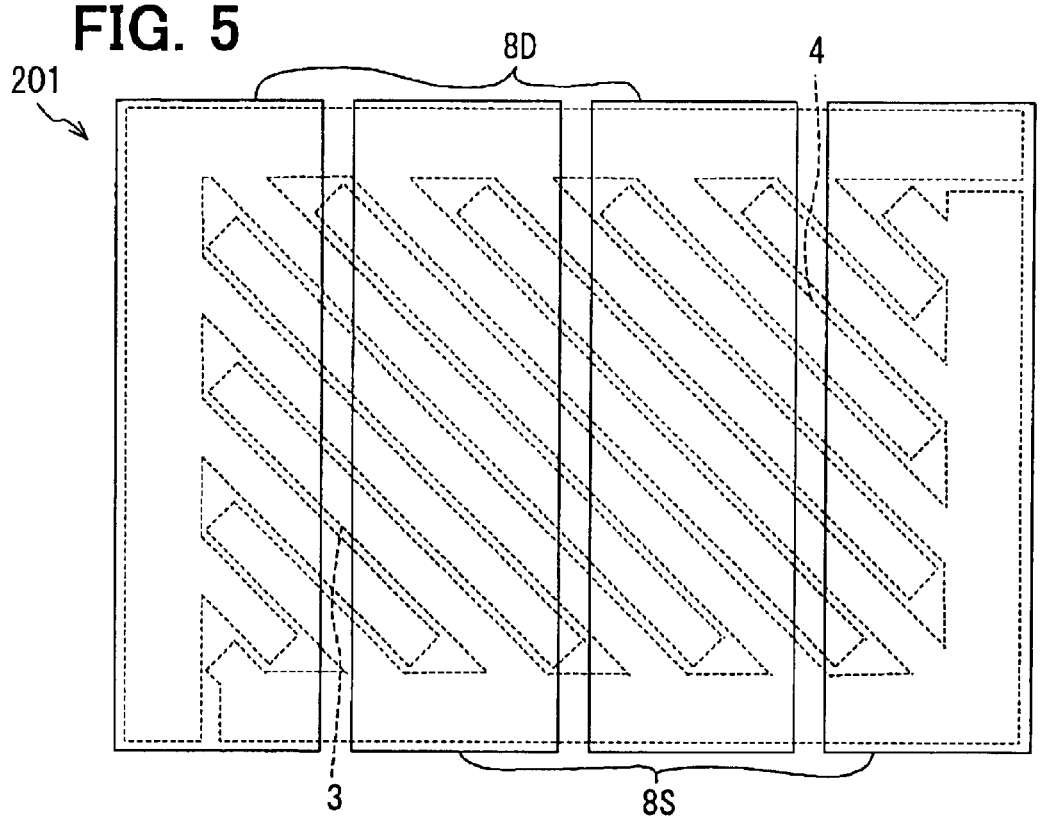
FIG. 5 is a schematic plan view explaining a CSP arrangement, according to the first embodiment.
Figure 6:
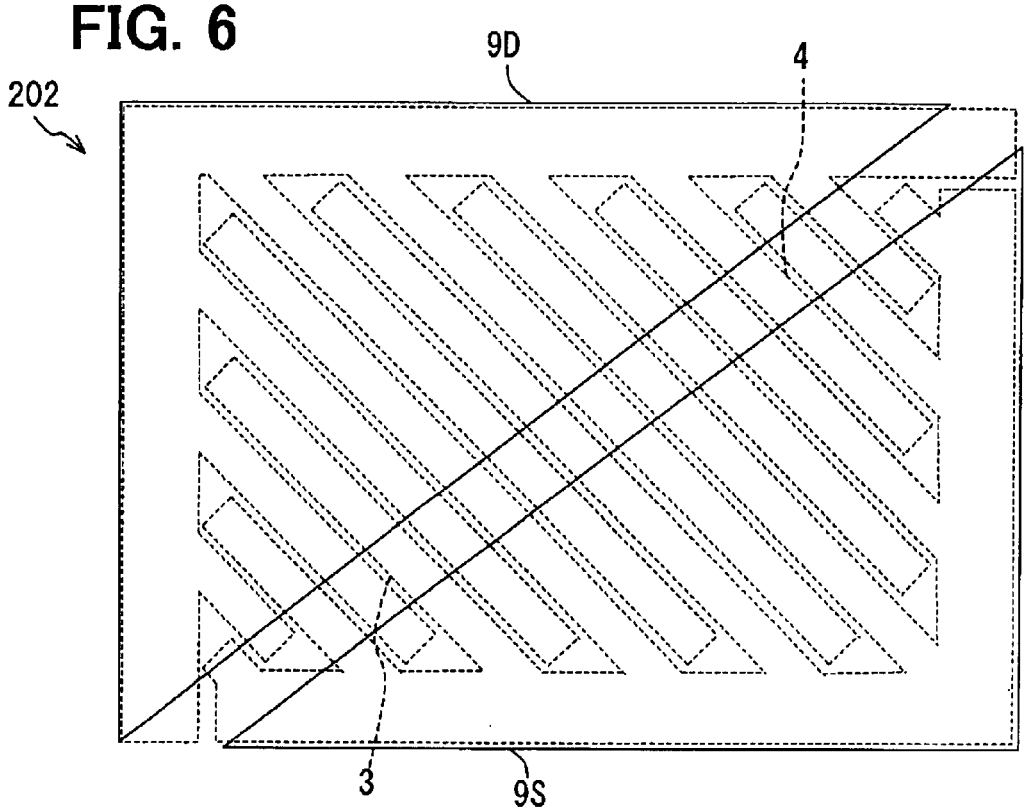
FIG. 6 is a schematic plan view explaining another CSP arrangement according to the first embodiment.

In this case, the third layer wiring for the CSP can be formed on the upper layer wiring, as shown in FIGS. 5 and 6. Semiconductor equipments 201, 202 have the third layer wirings, each of which is composed of the third source wiring 8S, 9S and the third drain wiring 8D, 9D. The third source wiring 8S, 9S connects to the second source wiring 3, and the third drain wiring 8D, 9D connects to the second drain wiring 4. In the semiconductor equipment 201, the third source and drain wirings 8S, 8D divide the semiconductor equipment 201 in quarters, and each of them has a rectangular shape. In the semiconductor equipment 202, the source and drain wirings 9S, 9D divide the semiconductor equipment 202 in two parts, and each of them has a triangle shape. Here, a via-hole (not shown) connects the third source wiring 8S, 9S and the second source wiring 3, and another via-hole (not shown) connects the third drain wiring 8D, 9D and the second drain wiring 4. These via-holes can be formed on a predetermined position. Since the second source and drain wirings 3, 4 have a plurality of stripes with wide width, the influence of the wiring resistance is reduced.

Both the third source wiring 8S, 9S and the third drain wiring 8D, 9D have wide areas shown in FIGS. 4 and 5. Therefore, a pad region can be formed on a predetermined position of the above wide area, so that the semiconductor equipment 201, 202 is packaged into a CSP.

Further, the semiconductor equipment 201, 202 has no connection portion 3R, 4R shown in FIG. 3. In other words, the third source and drain wirings 8S, 9S, 8D, 9D instead of the connection portion 3R, 4R connect the second source or drain wiring 3, 4 together. Thus, the source cell 20S or the drain cell 20D electrically connects together in parallel by using the second source or drain wiring 3, 4 with the third source and drain wirings 8S, 9S, 8D, 9D.

Figure 7A:
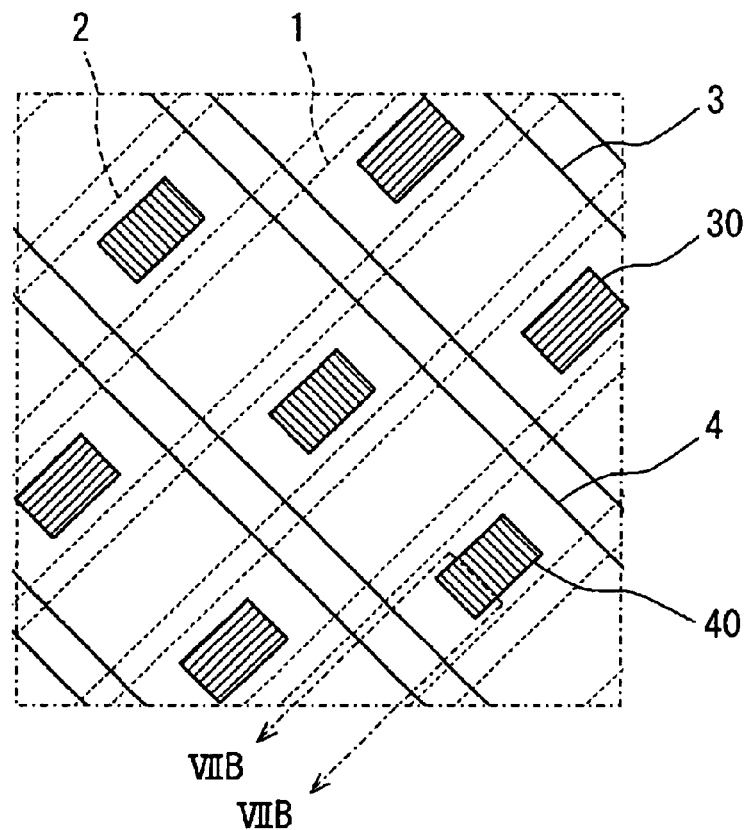
FIG. 7A is a partially enlarged plan view of a region A in FIG. 3.
Figure 7B:
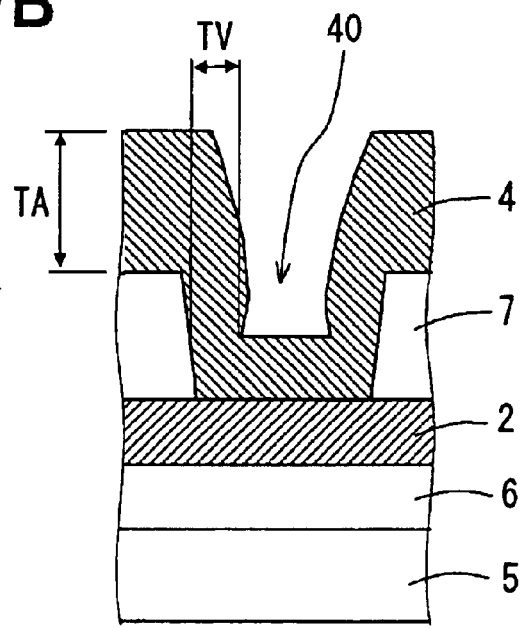
FIG. 7B is a cross-sectional view taken along line VIIB—VIIB in FIG. 7A.

FIG. 7A is a partially enlarged plan view showing an area A shown in FIG. 3. FIG. 7B is a cross-sectional view taken along line VIIB—VIIB in FIG. 7A. Each of the via-holes 30, 40 connects the thin first source or drain wiring 1, 2 and the thick second source or drain wiring 3, 4, respectively. A metallic film in the via-hole 30, 40 is simultaneously formed together with the second source and drain wirings 3, 4. A film thickness TV of the metallic film disposed on a sidewall of the via-hole 30, 40 is thinner than a film thickness TA of the second source and drain wirings 3, 4. In this case, current flowing through the metallic film in the via-hole 30, 40 is limited by the film thickness TV disposed on the sidewall of the via-hole 30, 40. Therefore, a cross-section of the current passing through the metallic film in the via-hole 30, 40 becomes larger, as the peripheral length of the via-hole 30, 40 becomes large. Therefore, it is preferred that the peripheral length of the via-hole 30, 40 becomes longer.

Figure 8:
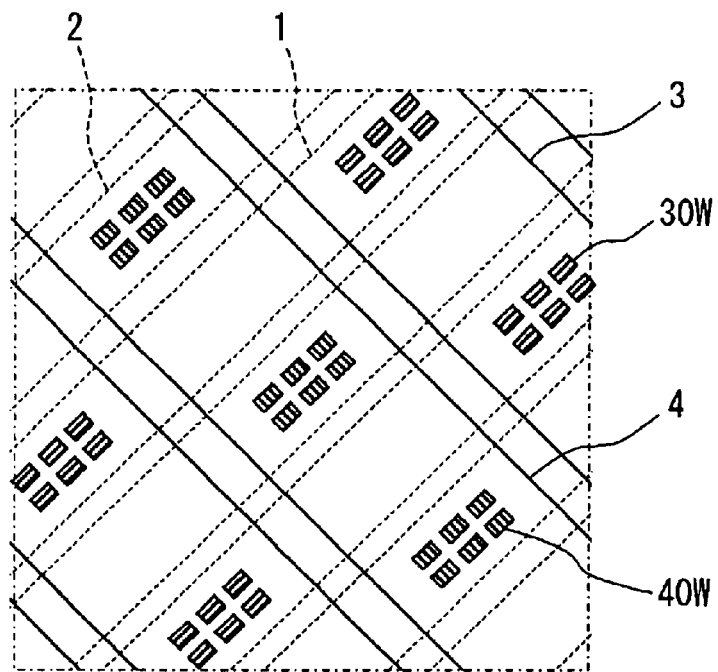
FIG. 8 is a partially enlarged plan view of the region A in FIG. 3 showing a plurality of via-holes, according to the first embodiment.

For example, a preferred via-hole 30W, 40W is shown in FIG. 8. Each via-hole 30W, 40W has six small via-holes disposed in one contact portion 21S, 21D between the first source or drain wiring 1, 2 and the second source or drain wiring 3, 4. Therefore, the total peripheral length of the via-hole 30W, 40W becomes longer than that of the via-hole 30, 40, so that the wiring resistance at the via-hole 30W, 40W is reduced. Although the via-hole 30W, 40W has six small via-holes, the via-hole 30W, 40W can have another number of small vial-holes, which is predetermined in accordance with an area of the contact portion 21S, 21D between the first source or drain wiring 1, 2 and the second source or drain wiring 3, 4.

Figure 9A:
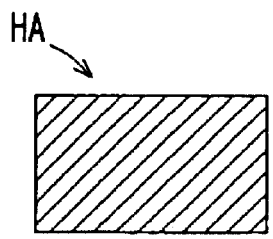
FIGS. 9A–9D are plan views showing various via-holes, according to a modification of the first embodiment.
Figure 9B:
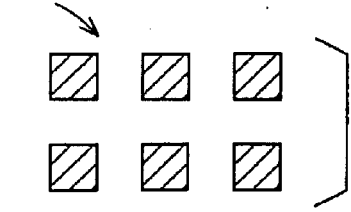
Figure 9C:
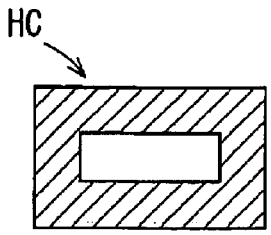
Figure 9D:
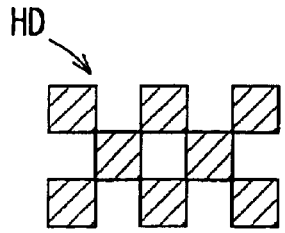

FIGS. 9A to 9D show various via-holes having different patterns. These via-holes have the same gross area. As shown in FIG. 9A, a via-hole HA has one large rectangular shaped via-hole. A via-hole HB shown in FIG. 9B has six square via-holes, the total peripheral length of the via-hole HB is about half time longer than that of the via-hole HA. In this case, the wiring resistance of the via-hole HB is two thirds of that of the via-hole HA. A via-hole HC shown in FIG. 9C has a ring shaped via-hole, the total peripheral length of the via-hole HC is about half time longer than that of the via-hole HA. In this case, the wiring resistance of the via-hole HC is two thirds of that of the via-hole HA. A via-hole HD shown in FIG. 9D has eight square via-holes, the total peripheral length of the via-hole HD is about twice longer than that of the via-hole HA. In this case, the wiring resistance of the via-hole HD is one-half of that of the via-hole HA.

Further, the sidewall of the via-hole 30, 40 can be formed into a tapered shape so that the metallic film disposed on the sidewall of the via-hole 30, 40 becomes thicker. The metallic film can be easily deposited on the sidewall of the via-hole 30, 40 having the tapered shape, so that the metallic film in the via-hole 30, 40 having the tapered shape is deposited thicker than that in the via-hole 30, 40 without any tapered shape is deposited. Thus, the wiring resistance of the via-hole 30, 40 having the tapered shape is reduced.

(Second Embodiment)

Figure 10:
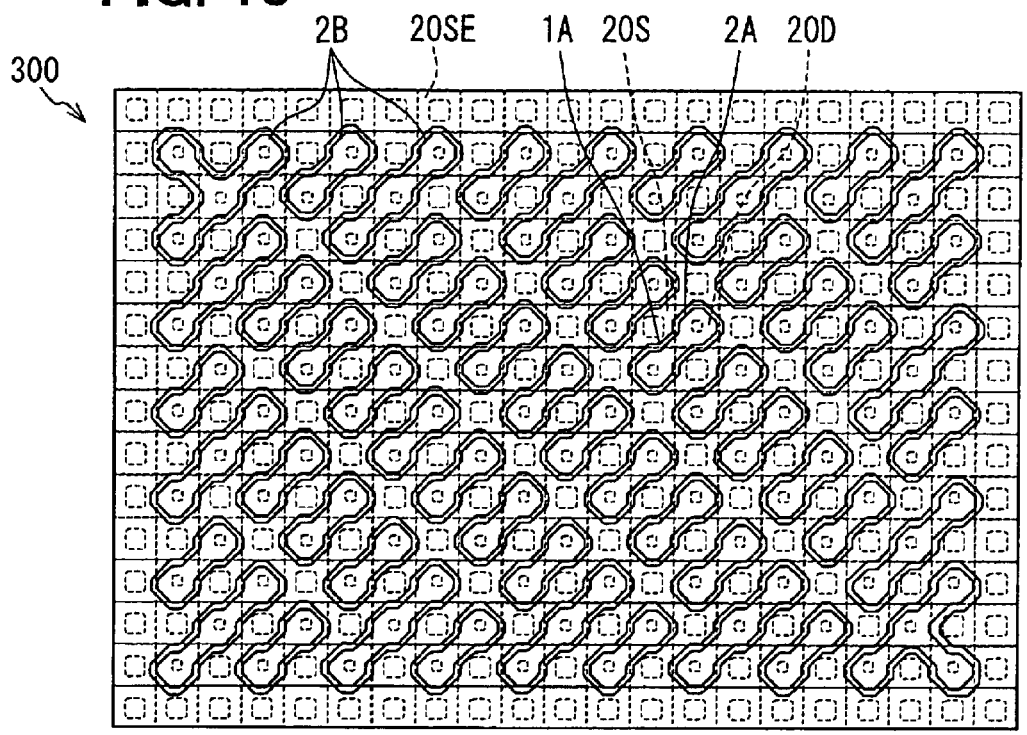
FIG. 10 is a plan view explaining an arrangement of a lower layer wiring of semiconductor equipment according to a second embodiment of the present invention.
Figure 11:
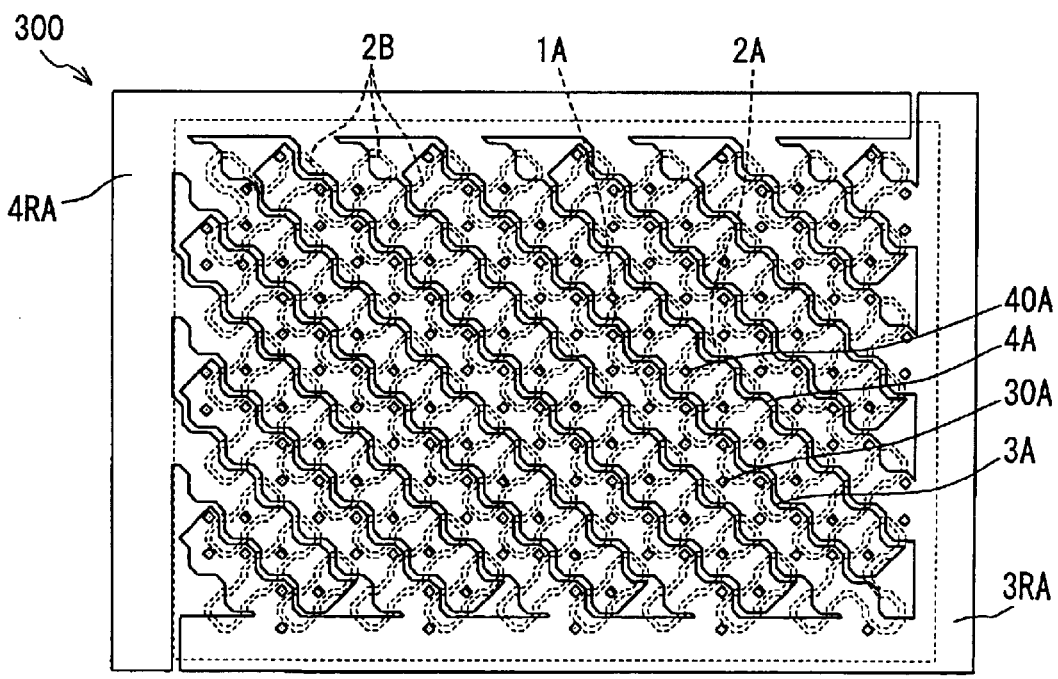
FIG. 11 is a plan view explaining a contact portion between upper and lower layer wirings of the semiconductor equipment according to the second embodiment.

Semiconductor equipment 300 according to a third embodiment of the present invention is shown in FIGS. 10 and 11. FIG. 10 shows the lower layer wiring of the semiconductor equipment 300. FIG. 11 shows the upper layer wiring and its contact portion between the upper and lower layer wirings. As shown in FIG. 10, the lower layer wiring is composed of the first drain wirings 2A, 2B and the first source wiring 1A. Each first drain wiring 2A, 2B connects neighboring two, three or four drain cells 20D disposed in the diagonal direction of the mesh pattern. The first source wiring 1A surrounds the first drain wirings 2A, 2B, and connects all the source cells 20S, 20SE. Here, the first drain wirings 2A, 2B is categorized into two groups according to the mesh pattern. One is the first drain wiring 2A, which is not adjacent to the source cell 20SE disposed on the periphery of the mesh pattern. The first drain wiring 2A connects two drain cells 20D disposed on the inner mesh pattern. The other is the first drain wiring 2B, which is adjacent to the source cell 20SE disposed on the periphery of the mesh pattern. The first drain wiring 2B connects two, three or four drain cells 20D.

As shown in FIG. 11, the second source and drain wirings 3A, 4A have a plurality of corrugated stripes, function of which are almost equal to the stripes of the second source and drain wirings 3, 4 shown in FIG. 3. The second drain wiring 4A connects to the first drain wirings 2A, 2B through a via-hole 40A. The second source wiring 3A connects to the first source wirings 1A through a via-hole 30A. Each width of the stripes of the second source and drain wirings 3A, 4A is wider than the minimum width of the stripes of the first source and drain wirings 1A, 2A, respectively. Here, the minimum width of the stripes of the first source wiring 1A is the width of the first source wiring 1A disposed between the stripes of the first drain wirings 2A. Each stripes of the first source and drain wirings 1A, 2A is connected by a connection portion 3RA, 4RA, so that the first source or drain wirings 1A, 2A has a comb shape. Thus, the source cell 20S, 20SE or the drain cell 20D is electrically connected together in parallel by both the first source or drain wiring 1A, 2A, 2B and the second source or drain wiring 3A, 4A, respectively.

In the semiconductor equipment 300, the current path of the first source and drain wirings 1A, 2A, 2B having narrow width becomes short, so that the influence of the wiring resistance of the first source and drain wirings 1A, 2A, 2B is reduced. Therefore, the current flows in each cell 20S, 20SE, 20D homogeneously so that the semiconductor equipment 300 has a high withstand voltage.

Although the gross area of the first source wiring 1 shown in FIG. 2 is almost equal to that of the first drain wiring 2, the gross area of the first source wiring 1A shown in FIG. 10 is larger than that of the first drain wiring 2A, 2B. Therefore, the wiring resistance of the first source wiring 1A is reduced, so that the source current flows mainly in the first source wiring 1A. On the other hand, the drain current flows mainly in the second drain wiring 4A, since the gross area of the first drain wirings 2A, 2B is small. Thus, the current flowing through the drain cell 20D mainly flows in the upper layer wiring, and the current flowing through the source cell 20S, 20SE of the L-DMOS transistor mainly flows in the lower layer wiring, so that the degree of freedom of patterning of the upper and lower wirings increases. Further, the total wiring resistance is reduced. Especially, when the semiconductor equipment 300 further includes another CMOS transistor or a bipolar transistor, the lower layer wiring made of aluminum is required to become downsized, for example, the thickness of the lower layer wiring is limited to be equal to or smaller than 0.7 μm. On the other hand, the width of the upper layer wiring may be large, so that the thickness of the upper layer wiring is, for example, 1.3 μm. Accordingly, the semiconductor equipment 300 having the lower layer wirings 1A, 2A, 2B can provide to become downsized and to reduce the wiring resistance.

Further, each connection portion 3RA, 4RA of the second source and drain wirings 3A, 4A can have a predetermined area so that the connection portion 3RA, 4RA is used as a pad region for forming a solder bump. Thus, the semiconductor equipment 300 can be mounted on a ceramic board or a printed circuit board so that the semiconductor equipment 300 is packaged into a CSP. Thus, a mounting area of the semiconductor equipment 300 is reduced.

Further, the third layer wiring can be formed on the upper layer wiring, i.e., the second source and drain wiring 3A, 4A so that the semiconductor equipment 300 is packaged into the CSP. Furthermore, each via-hole 30A, 40A between the lower layer wiring and the upper layer wiring can be formed into a predetermined pattern such as the via-holes 30W, 40W, HA, HB, HC, HD shown in FIGS. 7 and 8A–8D.

Figure 12:
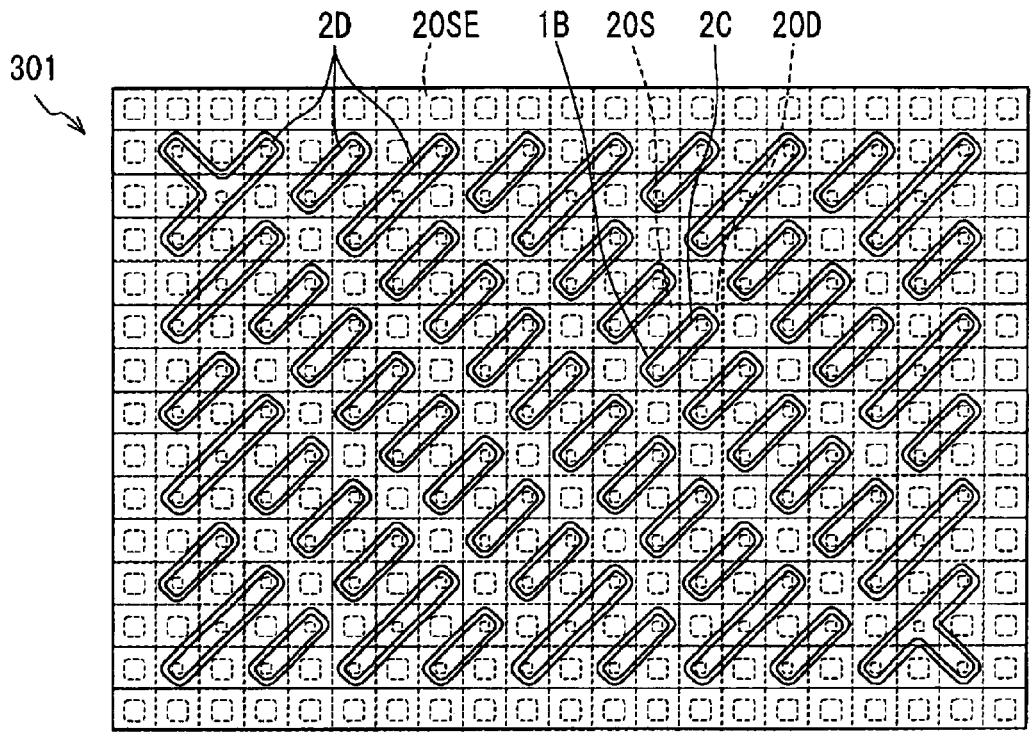
FIG. 12 a plan view explaining another arrangement of the lower layer wiring of the semiconductor equipment according to the second embodiment.
Figure 13:
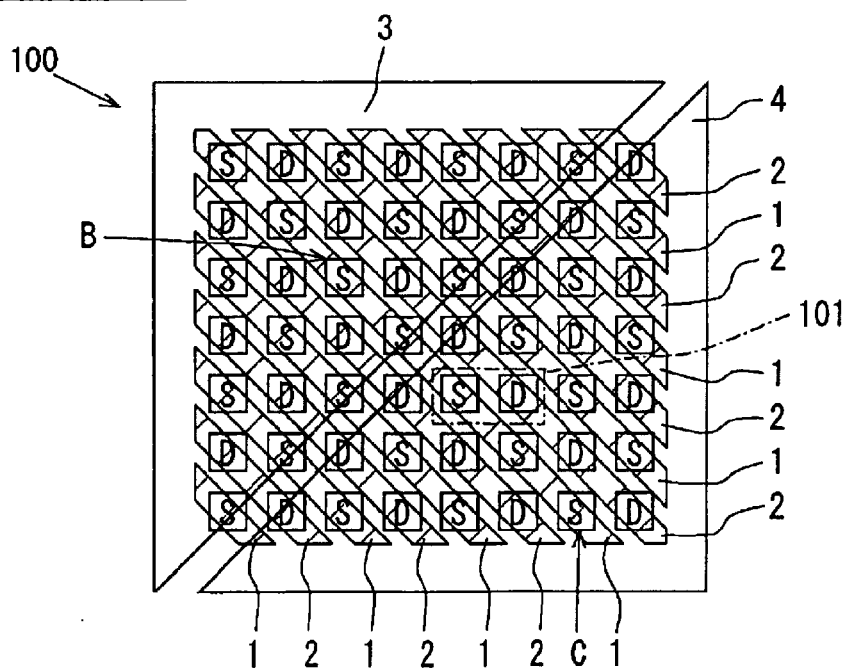
FIG. 13 is a schematic plan view showing semiconductor equipment according to a prior art.

Another semiconductor equipment 301 according to a modification of the second embodiment is shown in FIG. 12.

The semiconductor equipment 300 shown in FIG. 10 has the lower layer wiring, i.e., the first source and drain wirings 1A, 2A, 2B with the corrugated shapes, i.e., with concavity and convexity portions so as to become wider. Thus, a portion of the lower layer wiring around the contact portion is wider than the minimum width of the lower layer wiring. However, the semiconductor equipment 301 has the first source and drain wirings 1B, 2C, 2D with a straight striped shape. Specifically, the minimum width of the first drain wiring 2C, 2D is narrower than that of the first source wiring 1B disposed between the neighboring first drain wirings 2C, 2D.

In the semiconductor equipment 301, for example, the current flowing through the drain cell 20D can mainly flow in the upper layer wiring, and the current flowing through the source cell 20S, 20SE of the L-DMOS transistor can mainly flow in the lower layer wiring, so that the degree of freedom of patterning of the upper and lower wirings increases. Therefore, the total wiring resistance is much reduced. Further, the current path of the upper and lower layer wirings have no concavity and convexity portion in accordance with the size of the contact portion, so that the total wiring resistance is further reduced.

(Modification)

Although the source cell 20SE is disposed on the periphery of the mesh pattern, the drain cell can be disposed on the periphery of the mesh pattern. Further the drain cell can surround the inner mesh pattern, which is composed of the source cell and drain cell alternately disposed. In this case, as shown in FIG. 1, even when a trench is formed so as to surround the mesh pattern for insulating the semiconductor equipment, the trench does not cut a PN junction. Therefore, the current leakage is limited from being occurred. Specifically, assuming that the trench is disposed on the left side of the source cell and the right side of the drain cell, a PN junction between the N type semiconductor layer 10 and the P type channel diffusion region 11 contacts the trench disposed on the left side of the source cell. On the other hand, in the trench disposed on the right side of the drain cell, an interface between the N type semiconductor layer 10 and the N$^+$ type well region 16 does not form the PN junction. Therefore, when the drain cell is disposed on the periphery of the mesh pattern, the PN junction does not disposed on the periphery of the mesh pattern so that the current leakage or the insulation break down, which are caused by cutting the PN junction by the trench, is limited from being occurred. Here, when the drain cell is disposed on the periphery of the mesh pattern and the source and drain cells are disposed alternately in the inner mesh pattern, the relationship between the upper and lower layer wirings according to the source and drain cells is reversed.

Such changes and modifications are to be understood as being within the scope of the present invention as defined by the appended claims.

What is claimed is:

1. Semiconductor equipment comprising:
    a semiconductor substrate;
    a plurality of transistors having a source cell and a drain cell disposed alternately on the substrate so as to form a mesh pattern; and
    upper and lower layer wirings for electrically connecting the source cells and the drain cells,
    wherein the lower layer wiring includes a first source wiring having a plurality of stripes for connecting the neighboring source cells and a first drain wiring having a plurality of stripes for connecting the neighboring drain cells,
    wherein the upper layer wiring includes a second source wiring having a plurality of stripes for connecting to the first source wiring and a second drain wiring having a plurality of stripes for connecting to the first drain wiring, wherein the second source wiring has a width of the stripe, which is wider than that of the first source wiring, and the second drain wiring has a width of the stripe, which is wider than that of the first drain wiring, and wherein the stripes of the second source wiring and the second drain wiring are disposed alternately.

2. The semiconductor equipment according to claim 1, wherein the transistor is a lateral type metal oxide semiconductor transistor, and the source and drain cells are disposed on a principal plane of the substrate, wherein the upper and lower layer wirings are disposed on the substrate, wherein the first source wiring connects the neighboring source cells disposed in a diagonal direction of the mesh pattern, and the first drain wiring connects the neighboring drain cells disposed in the diagonal direction, wherein the second source wiring is disposed perpendicularly to the lower layer wiring, and connects to the first source wiring through a source via-hole, and wherein the second drain wiring is disposed perpendicularly to the lower layer wiring, and connects to the first drain wiring through a drain via-hole.

3. The semiconductor equipment according to claim 1, wherein the first drain wiring has a minimum width of the stripe, which is narrower than that of the first source wiring.

4. Semiconductor equipment comprising:

a semiconductor substrate;

a plurality of lateral type metal oxide semiconductor transistors having a source cell and a drain cell, which are disposed alternately on a principal plane of the substrate so as to form a mesh pattern; and upper and lower layer wirings disposed on the substrate for electrically connecting the source cells and the drain cells, wherein the lower layer wiring includes a first drain wiring for connecting the neighboring two drain cells disposed in a diagonal direction of the mesh pattern, and a first source wiring for connecting the source cells and surrounding the first drain wiring, wherein the upper layer wiring includes a second source wiring disposed perpendicularly to the first source wiring and having a plurality of stripes for connecting to the first source wiring through a source via-hole, and a second drain wiring disposed perpendicularly to the first drain wiring and having a plurality of stripes for connecting to the first drain wiring through a drain via-hole, wherein the second source wiring has a width of the stripe, which is wider than a minimum width of the stripe of the first source wiring disposed between the neighboring first drain wirings, and the second drain wiring has a width of the stripe, which is wider than a minimum width of the stripe of the first drain wiring, and wherein the stripes of the second source wiring and the second drain wiring are disposed alternately.

5. The semiconductor equipment according to claim 4, wherein the source cell is disposed on a periphery of the mesh pattern, and the source and drain cells are disposed alternately in an inner mesh pattern, wherein the first drain wiring is composed of a first type drain wiring and a second type drain wiring, wherein the first type drain wiring does not connect the drain cell adjacent to the source cell disposed on the periphery of the mesh pattern, and connects the neighboring two drain cells disposed in the diagonal direction of the mesh pattern, and wherein the second type drain wiring connects the neighboring two, three or four drain cells, which are disposed in the diagonal direction of the mesh pattern and include the drain cell adjacent to the source cell disposed on the periphery of the mesh pattern.

6. The semiconductor equipment according to claim 4, wherein the minimum width of the stripe of the first drain wiring is narrower than that of the first source wiring disposed between the neighboring two first drain wirings.

7. Semiconductor equipment comprising:

a semiconductor substrate;

a plurality of lateral type metal oxide semiconductor transistors having a source cell and a drain cell, which are disposed alternately on a principal plane of the substrate so as to form a mesh pattern; and upper and lower layer wirings disposed on the substrate for electrically connecting the source cells and the drain cells, wherein the lower layer wiring includes a first source wiring for connecting the neighboring two source cells disposed in a diagonal direction of the mesh pattern, and a first drain wiring for connecting the drain cells and surrounding the first source wiring, wherein the upper layer wiring includes a second source wiring disposed perpendicularly to the first source wiring and having a plurality of stripes for connecting to the first source wiring through a source via-hole, and a second drain wiring disposed perpendicularly to the first drain wiring and having a plurality of stripes for connecting to the first drain wiring through a drain via-hole, wherein the second source wiring has a width of the stripe, which is wider than a minimum width of the stripe of the first source wiring disposed between the neighboring first drain wirings, and the second drain wiring has a width of the stripe, which is wider than a minimum width of the stripe of the first drain wiring, and wherein the stripes of the second source wiring and the second drain wiring are disposed alternately.

8. The semiconductor equipment according to claim 7, wherein the drain cell is disposed on a periphery of the mesh pattern, and the source and drain cells are disposed alternately in an inner mesh pattern, wherein the first source wiring is composed of a first type source wiring and a second type source wiring, wherein the first type source wiring does not connect the source cell adjacent to the drain cell disposed on the periphery of the mesh pattern, and connects the neighboring two source cells disposed in the diagonal direction of the mesh pattern, and wherein the second type source wiring connects the neighboring two, three or four source cells, which are disposed in the diagonal direction of the mesh pattern and include the source cell adjacent to the drain cell disposed on the periphery of the mesh pattern.

9. The semiconductor equipment according to claim 7, wherein the minimum width of the stripe of the first drain wiring disposed between the neighboring two first source wirings is narrower than that of the first source wiring.

10. The semiconductor equipment according to claim 1, wherein each of the second source and drain wirings includes a plurality of stripe portions as a tooth of comb and a connection portion as a body of comb for connecting the stripe portions, and wherein the stripe portion of the second source wiring faces the stripe portion of the second drain wiring.

11. The semiconductor equipment according to claim 10, wherein each of the second source and drain wirings further includes a pad for forming a solder bump.

12. The semiconductor equipment according to claim 1, the equipment further comprising:

a third layer wiring disposed on the upper and lower layer wirings, wherein the third layer wiring includes a third source wiring for connecting to the second source wiring and a third drain wiring for connecting to the second drain wiring, and wherein each of the third source and drain wirings includes a pad for forming a solder bump.

13. The semiconductor equipment according to claim 2, wherein at least one of the source and drain via-holes disposed in a contact portion between the first and second source wirings or between the first and second drain wirings has a plurality of small via-holes.

14. The semiconductor equipment according to claim 2, wherein at least one of the source and drain via-holes disposed in a contact portion between the first and second source wirings or between the first and second drain wirings has a ring shape.

15. The semiconductor equipment according to claim 2, wherein at least one of the source and drain via-holes disposed in a contact portion between the first and second source wirings or between the first and second drain wirings has a tapered sidewall.

16. Semiconductor equipment comprising:

a semiconductor substrate;

a plurality of transistors having a source cell and a drain cell, which are disposed alternately on a principal plane of the substrate so as to form a mesh pattern;

a lower layer wiring disposed on the source and drain cells and including a first source wiring for connecting the source cells and a first drain wiring for connecting the drain cells; and an upper layer wiring disposed on the lower layer wiring and including a second source wiring for connecting to the first source wiring through a source via-hole and a second drain wiring for connecting to the first drain wiring through a drain via-hole, wherein at least one of the source and drain via-holes has a predetermined pattern so that a length of periphery of the via-hole becomes maximum.

17. The semiconductor equipment according to claim 16, wherein at least one of the source and drain via-holes has a plurality of small via-holes.

18. The semiconductor equipment according to claim 16, wherein at least one of the source and drain via-holes has a ring shape.

* * * * *